United States Patent
Afzali-Ardakani et al.

(10) Patent No.: US 11,857,997 B2
(45) Date of Patent: Jan. 2, 2024

(54) METAL SURFACE PROTECTION

(71) Applicant: International Business Machines Corporation, Armonk, NY (US)

(72) Inventors: Ali Afzali-Ardakani, Ossining, NY (US); David L. Rath, Stormville, NY (US); Sarunya Bangsaruntip, Mount Kisco, NY (US); George Gabriel Totir, Newtown, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/905,463

(22) Filed: Jun. 18, 2020

(65) Prior Publication Data
US 2021/0394229 A1  Dec. 23, 2021

(51) Int. Cl.
| | |
|---|---|
| *B05D 1/18* | (2006.01) |
| *B05D 1/02* | (2006.01) |
| *B05D 1/00* | (2006.01) |
| *B05D 3/00* | (2006.01) |
| *B05D 3/10* | (2006.01) |
| *B05D 3/14* | (2006.01) |
| *B05D 3/06* | (2006.01) |

(52) U.S. Cl.
CPC ............... *B05D 1/18* (2013.01); *B05D 1/005* (2013.01); *B05D 1/02* (2013.01); *B05D 3/005* (2013.01); *B05D 3/062* (2013.01); *B05D 3/102* (2013.01); *B05D 3/142* (2013.01); *B05D 2202/00* (2013.01); *B05D 2518/00* (2013.01)

(58) Field of Classification Search
None
See application file for complete search history.

(56) References Cited

U.S. PATENT DOCUMENTS

| | | | |
|---|---|---|---|
| 6,531,224 B1 | 3/2003 | Fryxell et al. | |
| 6,974,726 B2 | 12/2005 | Dani et al. | |
| 7,491,286 B2 | 2/2009 | Kagan et al. | |
| 8,658,258 B2 | 2/2014 | Hanson | |
| 9,691,987 B1 | 6/2017 | Han et al. | |
| 2003/0102471 A1* | 6/2003 | Kelley | H01L 51/0541 257/40 |

(Continued)

FOREIGN PATENT DOCUMENTS

WO    03032330 A2    4/2003

OTHER PUBLICATIONS

Campbell et al.; Dynamics of Oxidation of Aluminum Nanoclusters using Variable Charge Molecular-Dynamics Simulations on Parallel Computers; Physical Review Letters; vol. 82, No. 24; Jun. 14, 1999.*

(Continued)

*Primary Examiner* — Michael P. Rodriguez
(74) *Attorney, Agent, or Firm* — Amin, Turocy & Watson, LLP

(57) ABSTRACT

Techniques regarding methods and/or apparatuses for protecting metal substrates during one or more lithography processes are provided. For example, one or more embodiments described herein can comprise a method that can include coating a metal substrate with a polymer film that self-assembles on a metal oxide positioned on a surface of the metal substrate. The method can also include covalently bonding the polymer film to the metal oxide.

8 Claims, 11 Drawing Sheets

(56) References Cited

U.S. PATENT DOCUMENTS

| | | |
|---|---|---|
| 2004/0163758 A1 | 8/2004 | Kagan et al. |
| 2007/0077440 A1* | 4/2007 | Gawalt ................. A61L 27/306 |
| | | 428/469 |
| 2008/0050747 A1* | 2/2008 | Korlach ................. B82Y 30/00 |
| | | 435/6.11 |
| 2011/0287369 A1* | 11/2011 | Shibayama ............. C08L 83/04 |
| | | 430/316 |
| 2013/0095605 A1 | 4/2013 | Goto et al. |
| 2015/0252216 A1 | 9/2015 | Minegishi et al. |
| 2019/0048202 A1* | 2/2019 | Frauenrath ........... C09D 149/00 |
| 2019/0361011 A1* | 11/2019 | Kumar ................... G01N 33/68 |
| 2020/0058501 A1* | 2/2020 | Dutta .................. H01L 21/0337 |

OTHER PUBLICATIONS

Janssen "Self-assembling monolayers for organic thin-film transistors." Katholieke Universiteit Leuven Faculteit Wetenschappen Departement Chemie, Jun. 2006. 177 pages.

* cited by examiner

METAL SURFACE PROTECTION

BACKGROUND

The subject disclosure relates to protecting one or more metal substrates from a chemical reaction induced degradation, and more specifically, to protecting one or more metal substrates from degradation during one or more lithography processes employed in the fabrication of complementary metal-oxide-semiconductor ("CMOS") and/or post CMOS devices for advanced computing.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, apparatuses, and/or methods that can regard protecting metal substrates from one or more lithography processes are described.

According to an embodiment, a method is provided. The method can comprise coating a metal substrate with a polymer film that self-assembles on a metal oxide positioned on a surface of the metal substrate. Further, the method can comprise covalently bonding the polymer film to the metal oxide.

According to another embodiment, a method is provided. The method can comprise coating a metal substrate with an organic polymer film that includes a functional group that forms a self-assembled layer on a metal oxide surface of the metal substrate. Also, the method can comprise bonding the organic polymer film to the metal oxide surface.

According to another embodiment, an apparatus is provided. The apparatus can comprise a metal oxide surface located on a metal substrate. Also, the apparatus can comprise an organic polymer film positioned on the metal oxide, wherein the organic polymer film self-assembles and bonds to the metal oxide surface.

DETAILED DESCRIPTION

Figure 1:
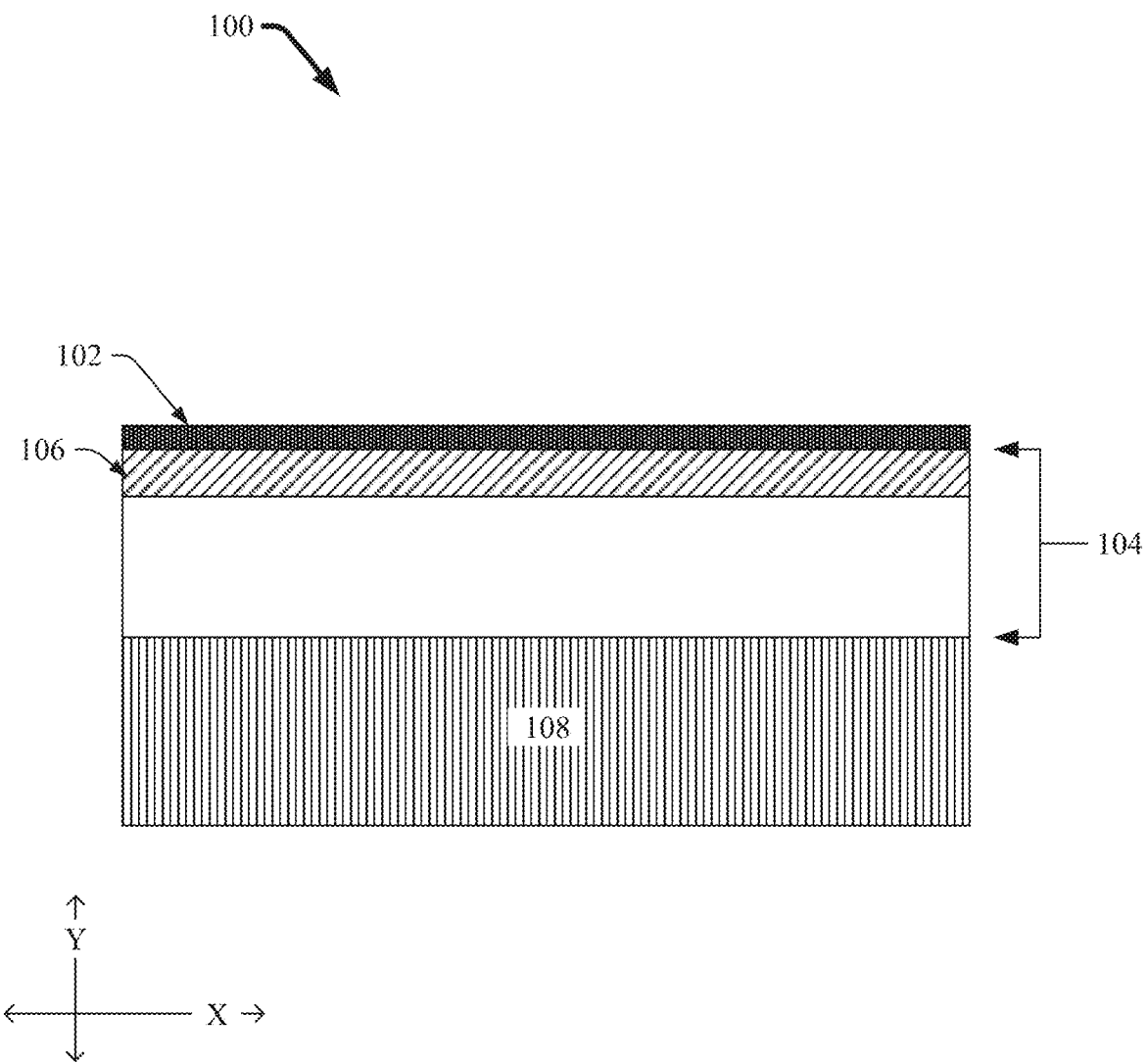
FIG. 1 illustrates a diagram of an example, non-limiting metal substrate protection structure that can be employed in preparation of one or more lithography processes in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

CMOS and post CMOS devices for advanced computing can be fabricated using one or more lithography processes to pattern metal materials (e.g., to pattern layers of aluminum, copper, nickel, and/or the like). The lithography processes can further involve the use of highly basic solutions (e.g., potassium hydroxide, tetramethylammonium hydroxide, and/or the like). However, the basic solutions used in the one or more lithography processes can have undesirable effects on one or more metal substrates being patterned. Thereby, the lithography process utilized to pattern one or more metal layers can negatively degrade one or more metal substrates of the device being fabricated.

Various embodiments described herein can regard one or more methods of protecting the metal substrates from degradation during the one or more lithography processes. For example, one or more embodiments described herein can regard the depositing of a film of organic polymers to coat and protect the metal substrate. For instance, the organic polymers can comprise one or more functional groups that can interact with one or more metal oxide surfaces of the metal substrate. In one or more embodiments, the polymer film can comprise polymers and/or co-polymers having one or more phosphonic acid groups (e.g., pendent functional groups) that can form covalent bonds with native metal oxides on the metal substrate and prevent basic solutions from reacting with the surface of the metal substrate during the lithography process. For instance, the one or more polymers and/or co-polymers can self-assemble on one or more metal oxide surfaces of the metal substrate to form a monolayer or thin film. Additionally, various embodiments described herein can regard one or more metal protection structures comprising the organic polymer film that can be established prior to the implementation of one or more lithography processes.

As described herein, the terms "lithography process" and/or "lithography processes" can refer to the formation of three-dimensional relief images or patterns on a substrate (e.g., a metal substrate) for subsequent transfer of the pattern to the substrate. In semiconductor lithography, the patterns can be formed by a light sensitive polymer called a photoresist. To build the complex structures that make up a semiconductor device and the many wires that connect the various features of a circuit, lithography processes and/or etch pattern transfer steps can be repeated multiple times. Each pattern being printed on the substrate can be aligned to the previously formed patterns and slowly the subject features (e.g., conductors, insulators and/or selectively doped regions) can be built up to form the final device.

As described herein, the terms "etching process", "etching process", "removal process", and/or "removal processes" can refer to any process that removes one or more first materials from one or more second materials. Example etching and/or removal processes can include, but are not limited to: wet etching, dry etching (e.g., reactive ion etching ("RIE")), chemical-mechanical planarization ("CMP"), a combination thereof, and/or the like.

FIG. 1 illustrates a diagram of an example, non-limiting metal protection structure 100 that can be established in preparation of one or more lithography processes in accordance with one or more embodiments described herein. Repetitive description of like elements employed in other embodiments described herein is omitted for sake of brevity. As shown in FIG. 1, the metal protection structure 100 can comprise one or more polymer films 102 that can coat and protect one or more metal substrates 104.

In various embodiments, the one or more metal substrates 104 can comprise one or more layers of a metal and/or metal alloy. Example metals that can be comprised within the one or more metal substrates 104 can include, but are not limited to: aluminum, copper, nickel, silicon, hafnium, titanium, a combination thereof, and/or the like. In one or more embodiments, the one or more metal substrates 104 can have a thickness (e.g., along the y-axis shown in FIG. 1) of, for example, greater than or equal to 20 nanometers (nm) and less than or equal to 5 micrometers. Further, one or more surfaces of the one or more metal substrates 104 can be oxidized, forming one or more metal oxide surfaces 106 of the metal substrates 104. Example metal oxides that can be comprised within the one or more metal oxide surfaces 106 can include, but are not limited to: aluminum oxide, copper oxide, nickel oxide, silicon oxide, hafnium oxide, titanium oxide, a combination thereof, and/or the like.

In various embodiments, the one or more metal oxide surfaces 106 can be native to the metal substrate 104. In one or more embodiments, the one or more metal oxide surfaces 106 can be the result of one or more oxidation conditions (e.g., originating from the ambient environment) and/or reactions (e.g., originating from one or more implemented chemical reactions). In one or more embodiments, the one or more metal oxide surfaces 106 can have a thickness (e.g., along the y-axis shown in FIG. 1) of, for example, greater than or equal to 1 nm and less than or equal to 10 nm. Additionally, while FIG. 1 illustrates the metal oxide surface 106 positioned at a single surface of the metal substrate 104, embodiments comprising one or more metal oxide surfaces 106 positioned at multiple surfaces of the metal substrate 104 are also envisaged. Further, the metal oxide surface 106 can cover an entirety of the metal substrate 104 surface or a portion of the metal substrate 104 surface.

In one or more embodiments, the one or more metal substrates 104, and thereby the one or more metal oxide surfaces 106, can be positioned on one or more semiconductor substrates 108. For example, the one or more semiconductor substrates 108 can be crystalline, semi-crystalline, microcrystalline, or amorphous. The semiconductor substrate 108 can comprise essentially (e.g., except for contaminants) a single element (e.g., silicon or germanium) and/or a compound (e.g., aluminum oxide, silicon dioxide, gallium arsenide, silicon carbide, silicon germanium, a combination thereof, and/or the like). The semiconductor substrate 108 can also have multiple material layers, such as, but not limited to: a semiconductor-on-insulator substrate ("SeOI"), a silicon-on-insulator substrate ("SOI"), germanium-on-insulator substrate ("GeOI"), silicon-germanium-on-insulator substrate ("SGOI"), a combination thereof, and/or the like. Additionally, the semiconductor substrate 108 can also have other layers, such as oxides with high dielectric constants ("high-K oxides") and/or nitrides. In one or more embodiments, the semiconductor substrate 108 can be a silicon wafer. In various embodiments, the semiconductor substrate 108 can comprise a single crystal silicon (Si), silicon germanium (e.g., characterized by the chemical formula SiGe), a Group III-V semiconductor wafer or surface/active layer, a combination thereof, and/or the like.

As shown in FIG. 1, the one or more polymer films 102 can be positioned on the one or more metal oxide surfaces 106. The one or more polymer films 102 can comprise one or more layers of organic polymers and/or co-polymers. Additionally, the one or more organic polymers and/or co-polymers can comprise one or more functional groups that can interact with the one or more metal oxide surfaces 106. In various embodiments, the one or more functional groups comprised within the one or more polymer films 102 can bond the one or more polymer films 102 to the one or more metal oxide surfaces 106 covalently and/or via one or more electrostatic interactions.

Example functional groups that can be included in the one or more organic polymers and/or co-polymers of the polymer film 102 can include, but are not limited to: phosphonic acid groups, hydroxamic acid groups, carboxylic acid groups, a combination thereof, and/or the like. Additionally, in one or more embodiments the one or more functional groups can enable the one or more organic polymers and/or co-polymers to self-assemble one or more layers on the metal oxide surface 106 to form the polymer film 102. For instance, polymer film 102 can be a self-assembled monolayer (e.g., a single layer of the polymers and/or co-polymers, such that the dimensions of the polymer film 102 does not exceed the molecular dimensions of the constituent molecules). Alternatively, the one or more polymer films 102 can comprise a plurality of self-assembled layers of the one or more organic polymers and/or co-polymers. For instance, the one or more polymer films 102 can be thin film comprising a plurality of monolayers. In one or more embodiments, the one or more polymer films 102 can have a thickness (e.g., along the y-axis shown in FIG. 1) of, for example, greater than or equal to 1 nm and less than or equal to 500 nm. Example organic polymers and/or co-polymers that can be comprised within the one or more polymer films 102, and/or that can have the one or more functional groups, can include, but are not limited to: poly(styrenephosphonic) acid,-co-poly(styrene-vinylphosphonic acid), poly(vinylphosphonic acid), poly(vinylphosphonic acid)-co-poly (methacrylic acid), a combination thereof, and/or the like. In various embodiments, the one or more polymer films 102 can cover an entirety of the metal oxide surface 106 or a portion of the metal oxide surface 106. For example, the one or more polymer films 102 can coat the one or more metal oxide surfaces 106 in a continuous, or near continuous, manner.

In various embodiments, the metal protection structure 100 can be formed during the fabrication of one or more CMOS or post CMOS devices. For example, one or more additional metal layers can be lithographically patterned onto the metal protection structure 100, wherein the polymer film 102 can protect the metal substrate 104 from degradation by the one or more lithography processes. For instance, the one or more polymer films 102 can protect the one or more metal substrates 104 from chemically reacting with one or more basic solutions employed during implementation of the one or more lithography processes.

Figure 2:
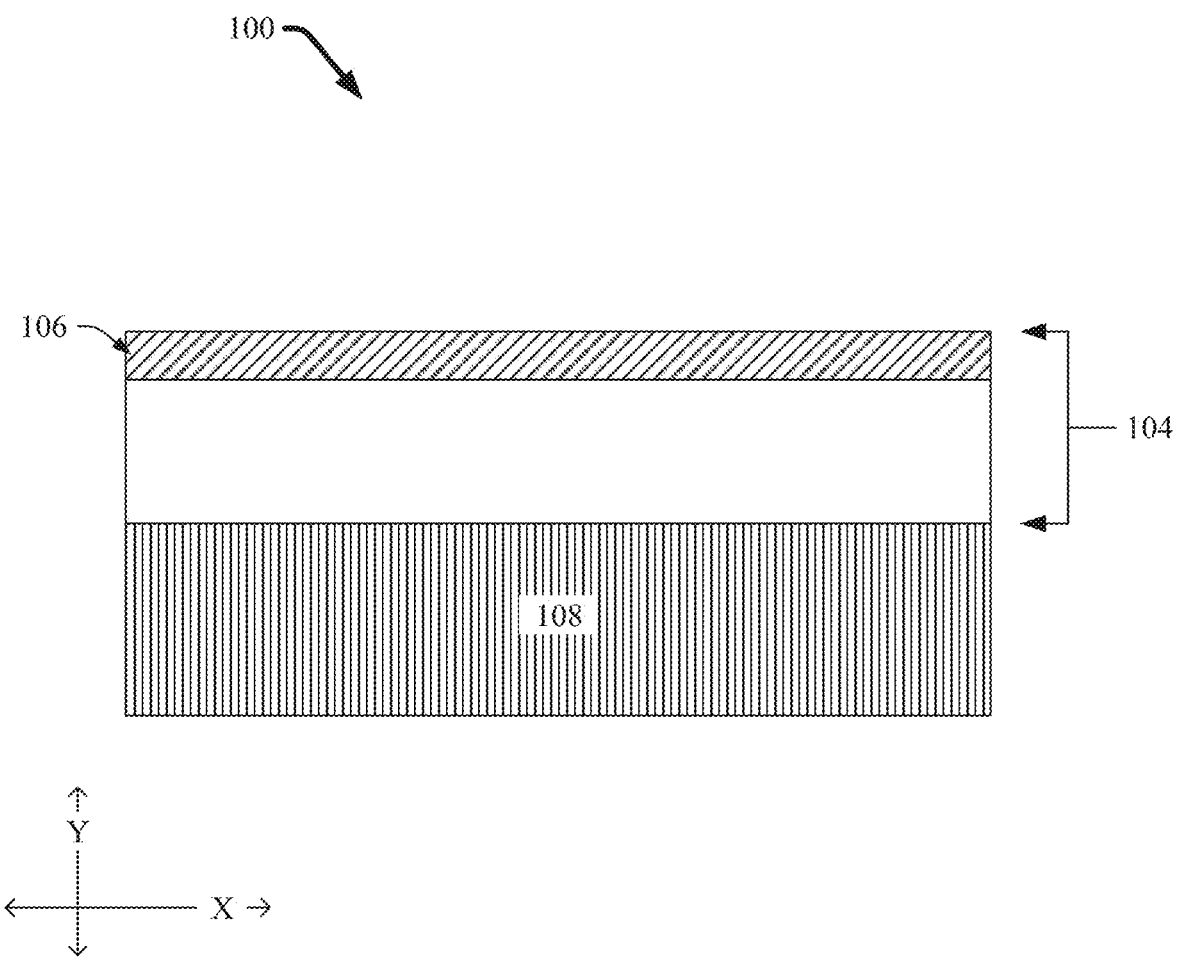
FIG. 2 illustrates a diagram of an example, non-limiting metal substrate protection structure during a first stage of manufacturing in accordance with one or more embodiments described herein.

FIG. 2 illustrates a diagram of the example, non-limiting metal protection structure 100 during a first stage of manufacturing in accordance with one or more embodiments described herein. Repetitive description of like elements employed in other embodiments described herein is omitted for sake of brevity. During a first stage of manufacturing, the one or more metal substrates 104 can be cleaned prior to depositing the one or more polymer films 102. For example, the one or more metal substrates 104 and/or metal oxide surfaces 106 can be cleaned via one or more cleaning processes that can include, but are not limited to: an oxygen plasma cleaning, an ultraviolet-ozone cleaning, a wet process cleaning (e.g., comprising a successive wash with acetone, alcohol, and water), a combination thereof, and/or the like. Additionally, the one or more cleaning processes can include one or more drying steps. For instance, the one or more metal substrates 104 and/or metal oxide surfaces 106 can be dried under inert gas (e.g., nitrogen).

In various embodiments, the one or more cleaning processes performed at the first stage of manufacturing can remove one or more contaminants and/or debris from the one or more metal oxide surfaces 106 that could otherwise impede one or more interactions between the one or more polymer films 102 and metal oxide surfaces 106. For example, contaminants such as oils, dust, grit, grime, and/or dirt can inhibit covalent bonding between the one or more polymers and/or co-polymers of the polymer films 102 and the one or more metal oxide surfaces 106 such that the polymer film 102 subsequently forms in a discontinuous manner (e.g., resulting in one or more gaps within the polymer film 102).

In various embodiments, the first stage of manufacturing can comprise cleaning the one or more metal substrates 104 with an oxygen plasma cleaning process. The oxygen plasma cleaning process can include plasma generated by a radio-frequency electromagnetic field, a direct current ("DC") electromagnetic filed, a pulsed DC electromagnetic field, and/or an asymmetric pulsed electromagnetic field. In one or more embodiments, the oxygen plasma can be generated by intense ultra-violet light. In one or more embodiments, the oxygen plasma can generate one or more metal oxide groups on the surface of the metal substrate 104 to generate and/or contribute to the one or more metal oxide surfaces 106. Additionally, the first stage of manufacturing can include a plurality of cleaning processes. For instance, the one or more metal substrates 104 can be rinsed with a cleaning solvent and treated with oxygen plasma.

Figure 3:
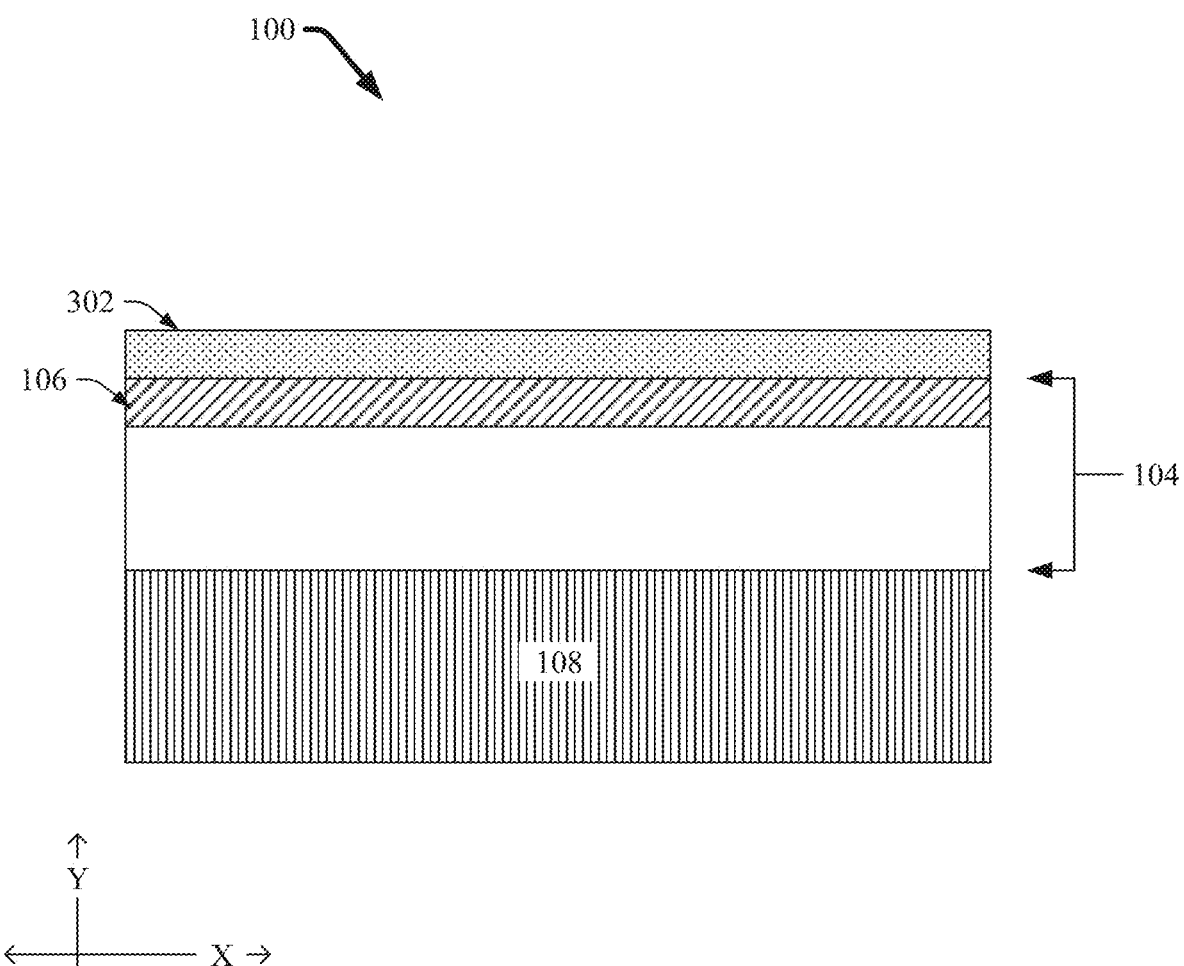
FIG. 3 illustrates a diagram of an example, non-limiting metal substrate protection structure during a second stage of manufacturing in accordance with one or more embodiments described herein.

FIG. 3 illustrates a diagram of the example, non-limiting metal protection structure 100 during a second stage of manufacturing in accordance with one or more embodiments described herein. Repetitive description of like elements employed in other embodiments described herein is omitted for sake of brevity. During a second stage of manufacturing, one or more aqueous solutions 302 comprising the one or more polymers, co-polymers, and/or functional groups comprised within the one or more polymer films 102 can be deposited onto the one or more metal substrates 104 (e.g., onto the one or more metal oxide surfaces 106).

The one or more aqueous solutions 302 can comprise the one or more polymers and/or co-polymers of the polymer films 102 in conjunction with one or more solvents and/or surfactants. For instance, the one or more polymers and/or co-polymers of the polymer films 102 can be water soluble, and the one or more aqueous solutions 302 can comprise the one or more polymers and/or co-polymers in water. The one or more aqueous solutions 302 can be deposited via one or more deposition processes that can include, but are not limited to: spin coating, doctor blading, immersion coating (e.g., dip coating), roller coating, spray coating, wipe coating, a combination thereof, and/or the like. For instance, the one or more aqueous solutions 302 can be spin coated onto the one or more metal oxide surfaces 106, wherein the metal substrate 104 can be flooded with the aqueous solution 302 and then spun to facilitate an even, or substantially even, distribution of the aqueous solution 302 across the one or more metal oxide surfaces 106. In another instance, the one or more aqueous solutions 302 can be immersion coated onto the one or more metal oxide surfaces 106, wherein the metal substrate 104 can be immersed in the aqueous solution 302 and then withdrawn to facilitate deposition of the aqueous solution 302 across the one or more metal oxide surfaces 106.

Additionally, the one or more aqueous solutions 302 can be deposited onto the metal substrates 104 (e.g., onto the one or more metal oxide surfaces 106) to one or more desired thicknesses (e.g., along the y-axis shown in FIG. 3). One of ordinary skill in the art will recognize that the desired thickness can vary depending, for example, on the one or more lithography processes to be subsequently implemented.

In accordance with various embodiments described herein, the one or more polymers and/or co-polymers included in the aqueous solution 302 that subsequently forms the polymer film 102 can include one or more alkyl and/or aryl molecular backbones (e.g., a polystyrene, polyvinyl, and/or poly(styrene-vinyl) molecular backbone) having one or more functional groups (e.g., one or more pendent phosphonic acid groups). In one or more embodiments, the one or more polymers and/or co-polymers can form self-assembled monolayers on the one or more metal oxide surfaces 106, wherein the one or more functional groups can covalently bond with one or more oxide groups and/or hydroxyl groups of the metal oxide surfaces 106. Further, the molecular backbones of the polymers and/or co-polymers can arrange themselves in an ordered array substantially parallel to each other and/or, for example, substantially perpendicular to the one or more metal oxide surfaces 106. For instance, the one or more functional groups can be head groups of the one or more polymers and/or co-polymers bonded to the one or more metal oxide surfaces 106, wherein the molecular backbones of the polymers and/or co-polymers can be tail groups that interact with neighboring polymers and/or co-polymers.

Figure 4:
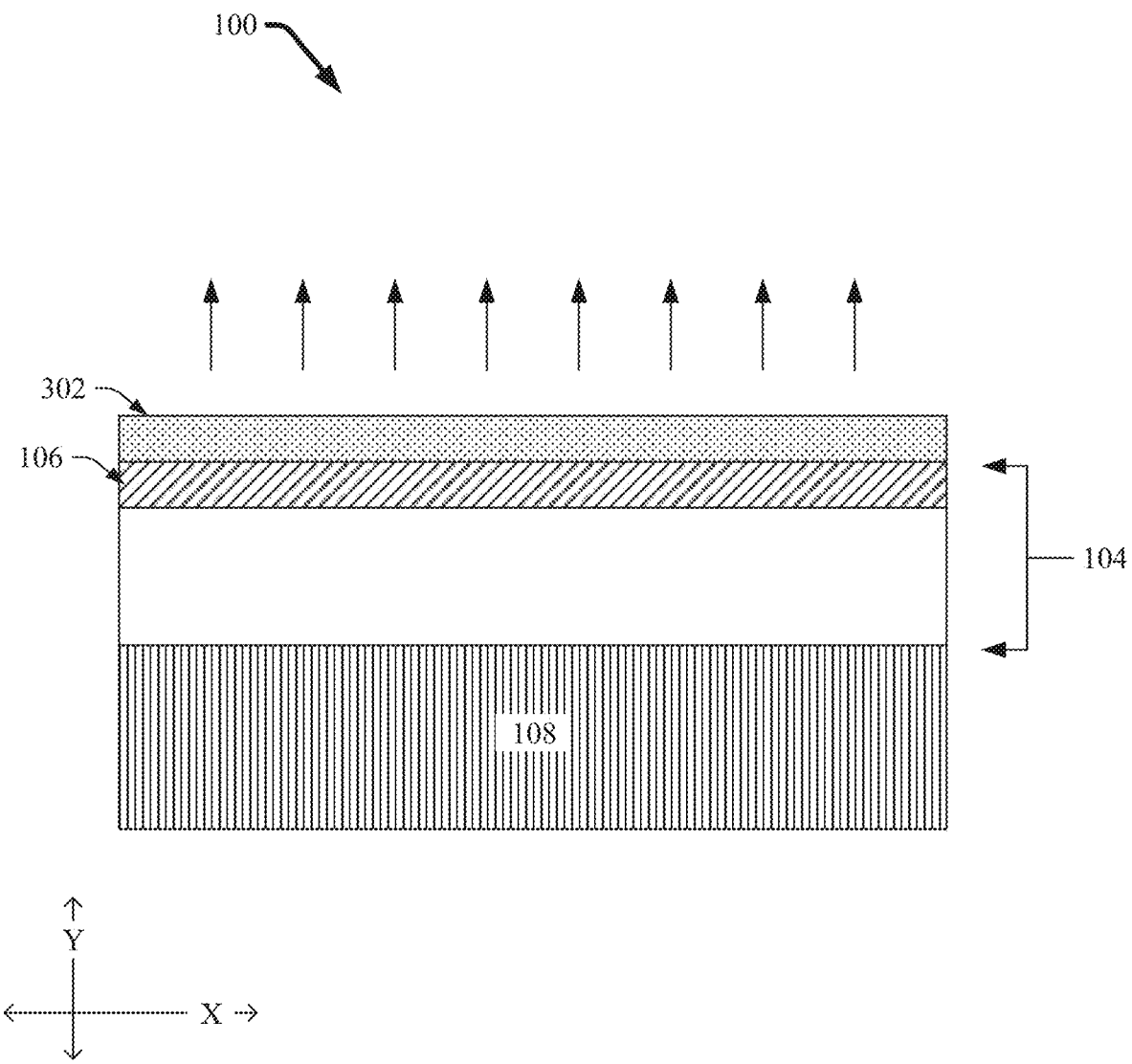
FIG. 4 illustrates a diagram of an example, non-limiting metal substrate protection structure during a third stage of manufacturing in accordance with one or more embodiments described herein.

FIG. 4 illustrates a diagram of the example, non-limiting metal protection structure 100 during a second stage of manufacturing in accordance with one or more embodiments described herein. Repetitive description of like elements employed in other embodiments described herein is omitted for sake of brevity. During a third stage of manufacturing, the one or more solvents and/or surfactants of the aqueous solution 302 can be removed from the one or more metal oxide surfaces 106. For example, the one or more aqueous solutions 302 can be subjected to heat, reduced pressure, ventilation, a combination thereof, and/or the like. By removing the one or more diluents (e.g., solvents and/or surfactants) of the aqueous solution 302, the metal protection structure 100 depicted in FIG. 1 can be achieved.

In one or more embodiments, the one or more metal substrates 104 and/or metal oxide surfaces 106 can be heated. The heat can evaporate one or more solvents and/or surfactants from the one or more aqueous solutions 302 and/or can catalyze one or more interactions between the one or more polymers and/or co-polymers of the polymer film 102 and the metal oxide surfaces 106. For example, evaporation of the one or more solvents of the aqueous solution 302 can be represented by the plurality of arrows depicted in FIG. 4. In various embodiments, the one or more metal substrates 104 and/or metal oxide surfaces 106 can be heated to a temperature ranging from, for example, greater than or equal to 80 degrees Celsius (° C.) and less than or equal to 150° C. (e.g., 100-140° C.). Additionally, the one or more metal substrates 104 and/or metal oxide surfaces 106 can be heated for a period of time ranging from, for example, greater than or equal to 1 minute and less than or equal to 30 minutes (e.g., 1-5 minutes).

Figure 5:
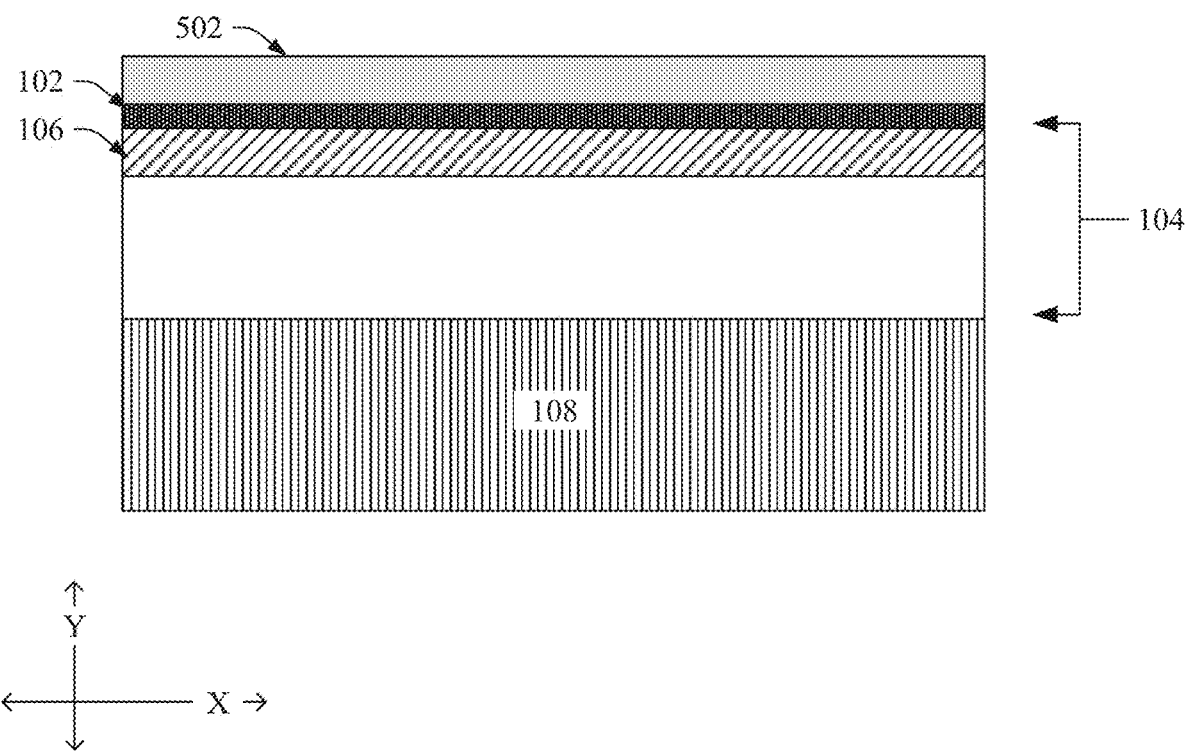
FIG. 5 illustrates a diagram of an example, non-limiting metal substrate protection structure during a first stage of a lithography process in accordance with one or more embodiments described herein.

FIG. 5 illustrates a diagram of the example, non-limiting metal protection structure 100 being implemented within a first stage of one or more lithography processes in accordance with one or more embodiments described herein. Repetitive description of like elements employed in other embodiments described herein is omitted for sake of brevity. During the first stage of the one or more lithography processes, the metal protection structure 100 can be cleaned and/or prepared for a photoresist 502, and/or the photoresist 502 can be deposited onto the one or more polymer films 102.

Subsequent to formation of the one or more polymer films 102, an exposed surface of the polymer films 102 can be cleaned in preparation of the photoresist 502. For example, one or more contaminants can be removed from the surface of the polymer film 102 via a wet chemical treatment that can include, for instance, solutions of hydrogen peroxide, trichloroethylene, acetone, methanol, and/or the like. Additionally, the metal protection structure 100 can be heated to a temperature sufficient to remove any moisture. Further, a layer of the photoresist 502 can be deposited onto the one or more polymer films 102 via one or more deposition processes. For example, the photoresist 502 can be deposited via one or more spin coating depositions to provide a uniform thickness (e.g., along the y-axis shown in FIG. 5). Wherein the photoresist 502 is deposited via an aqueous solution (e.g., via a spin coating deposition), one or more diluents (e.g., solvents) of the aqueous solution can be evaporated (e.g., via heating) to achieve the final thickness (e.g., along the y-axis shown in FIG. 5) of the photoresist 502. For example, the photoresist 502 can have a thickness (e.g., along the y-axis) ranging from greater than or equal to 0.5 micrometers and less than or equal to 5.0 micrometers.

The photoresist 502 can comprise one or more photoactive compounds ("PAC") that can be sensitive to radiation (e.g., light) exposure. For instance, the one or more PACs can undergo a chemical change in the presence of radiation exposure that alters the solubility of the PACs. Example PACs that can be comprised within the one or more photoresists 502 can include, but are not limited to: diazonaphthaquinone, chemically amplified positive-tone resists containing partially protected poly(hydroxystyrene) and a photoacid generator, a combination thereof, and/or the like. The chemical change can render the PACs soluble or insoluble in one or more developers subsequently used to remove a portion of the photoresist 502 and form a pattern in the photoresist 502. For example, a positive photoresist 502 can comprise one or more PACs that become soluble in the developer once exposed to radiation (e.g., light); thereby subjecting the exposed portions to subsequent removal to form the photoresist 502 pattern. In another example, a negative photoresist 502 can comprise one or more PACs that become insoluble in the developer once exposed to radiation (e.g., light); thereby subjecting the portions protected from radiation to subsequent removal to form the photoresist 502 pattern.

Figure 6:
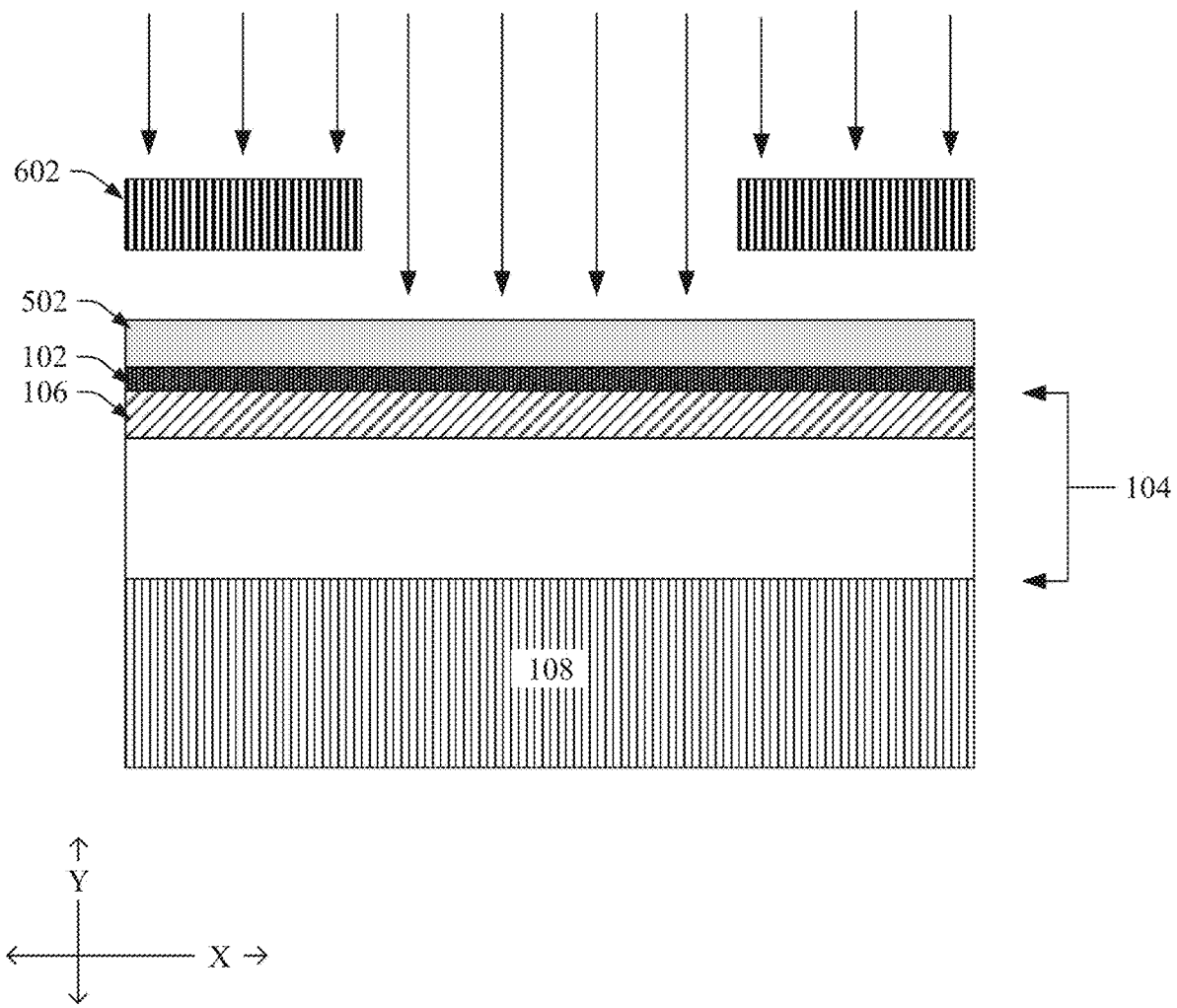
FIG. 6 illustrates a diagram of an example, non-limiting metal substrate protection structure during a second stage of a lithography process in accordance with one or more embodiments described herein.

FIG. 6 illustrates a diagram of the example, non-limiting metal protection structure 100 being implemented within a second stage of one or more lithography processes in accordance with one or more embodiments described herein. Repetitive description of like elements employed in other embodiments described herein is omitted for sake of brevity. During the second stage of the one or more lithography processes, one or more portions of the photoresist 502 can be exposed to radiation (e.g., light) in order to pattern the photoresist 502.

As shown in FIG. 6, one or more photomasks 602 can be utilized to cover one or more portions of the photoresist 502. The portions of the photoresist 502 covered by the one or more photomasks 602 can be protected from exposure to radiation (e.g., represented by the down-ward pointing arrows in FIG. 6). Additionally, portions of the photoresist 502 that are not covered by the one or more photomasks 602 can be exposed to the radiation. Thereby, a pattern of chemical reactivity in the photoresist 502 can be directed by the positioning of the one or more photomasks 602. In accordance with the various embodiments described herein, the exposed portions of the photoresist 502 can undergo a chemical alteration induced by the radiation (e.g., light) that renders the portions soluble or insoluble in the presence of a developer.

Figure 7:
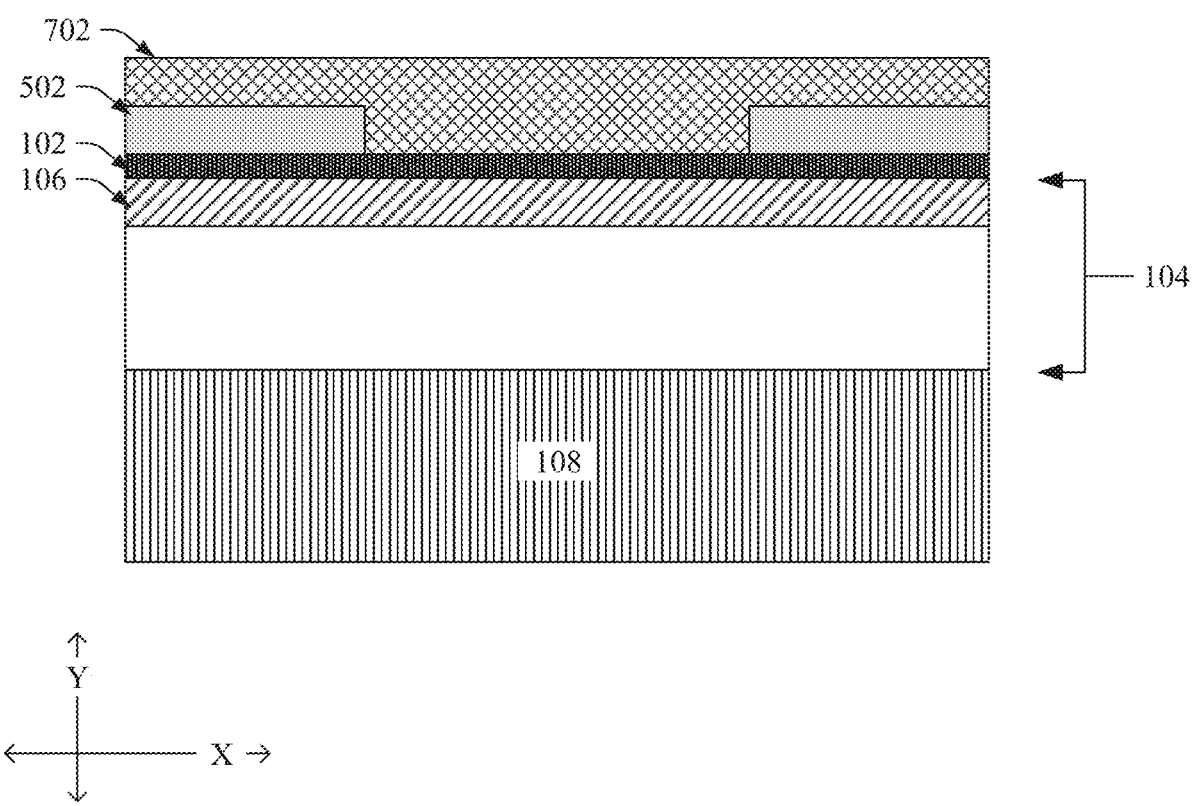
FIG. 7 illustrates a diagram of an example, non-limiting metal substrate protection structure during a third stage of a lithography process in accordance with one or more embodiments described herein.

FIG. 7 illustrates a diagram of the example, non-limiting metal protection structure 100 being implemented within a third stage of one or more lithography processes in accordance with one or more embodiments described herein. Repetitive description of like elements employed in other embodiments described herein is omitted for sake of brevity. During the third stage of the one or more lithography processes, one or more developer solutions 702 can be utilized to removed one or more portions of the photoresist 502.

The one or more developer solutions 702 can be deposited onto the photoresist 502 to remove one or more portions of the photoresist 502 (e.g., via spin development, spray development, batch development, puddle development, and/or the like). For example, FIG. 7 depicts a positive photoresist 502, in which the photoresist 502 portions exposed to radiation (e.g., light) have become soluble in the developer solution 702, while the previously covered portions of the photoresist 502 (e.g., protected by the one or more photomasks 602)

remain insoluble in the developer solution 702. The one or more developer solutions 702 can comprise base compounds that can be reactive with the metal substrate 104. Example base compounds comprised within the one or more developer solutions 702 can include, but are not limited to: potassium hydroxide, tetramethylammonium hydroxide, tetraethylammonium hydroxide, sodium hydroxide (e.g., used with sodium chloride as a high-contrast developer for electron beam resists), a combination thereof, and/or the like. However, the one or more polymer films 102 can protect the metal substrate 104 from chemical interaction with the one or more developer solutions 702. In accordance with various embodiments described herein, the one or more polymer films 102 can coat one or more surfaces of the metal substrate 104 (e.g., coat the one or more metal oxide surfaces 106), and thereby form a barrier between the developer solution 702 and the metal substrate 104. In one or more embodiments, the one or more polymer films 102 can be insoluble and/or inert, or substantially inert, with regards to the one or more developer solutions 702.

As shown in FIG. 7, as the one or more developer solutions 702 remove portions of the photoresist 502, one or more underlying portions of the metal substrate 104 would have otherwise been exposed to the developer solutions 702 absent the protection granted by the one or more polymer films 102. For instance, the one or more polymer films 102 can remain positioned between the one or more developer solutions 702 and the metal substrate 104 despite the solubility of one or more portions of the photoresist 502.

Figure 8:
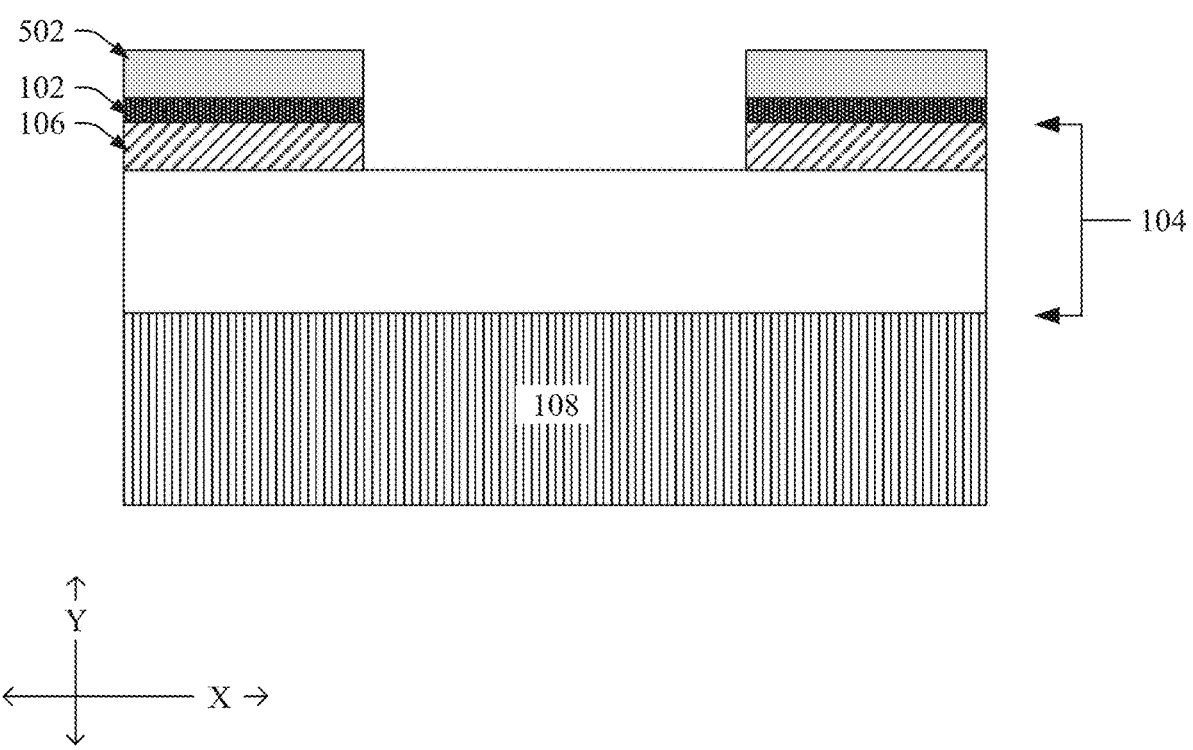
FIG. 8 illustrates a diagram of an example, non-limiting metal substrate protection structure during a fourth stage of a lithography process in accordance with one or more embodiments described herein.

FIG. 8 illustrates a diagram of the example, non-limiting metal protection structure 100 being implemented within a fourth stage of one or more lithography processes in accordance with one or more embodiments described herein. Repetitive description of like elements employed in other embodiments described herein is omitted for sake of brevity. During the fourth stage of the one or more lithography processes, the one or more developer solutions 702 can be removed in preparation for one or more subsequent implantation and/or etching processes to the metal substrate 104.

Removal of the one or more developer solutions 702 can inherently include removal of the one or more soluble portions of the photoresist 502. Thereby, a pattern can be formed in the photoresist 502, wherein the photoresist 502 pattern covers one or more portions of the polymer film 102 and metal substrate 104 and leaves other portions of the polymer film 102 and metal substrate 104 exposed. In various embodiments, the patterned photoresist 502 can be heated to harden the photoresist 502. For example, the heat can induce crosslinking within the photoresist 502, and thereby render the photoresist 502 more thermally stable.

As shown in FIG. 8, the photoresist 502 pattern can guide one or more implantation and/or etching process of the metal substrate 104. For example, FIG. 8 illustrates an embodiment in which the metal substrate 104 can be subject to one or more etching processes. Portions of the polymer film 102 and/or metal substrate 104 covered by the photoresist 502 pattern can be protected from the one or more etching processes. In contrast, portions of the polymer film 102 and/or metal substrate 104 left exposed by the photoresist 502 pattern can be subject to the one or more etching processes. In various embodiments, one or more implants can be deposited into the portions of the polymer film 102 and/or metal substrate 104 left exposed by the photoresist 502. Thereby, the pattern of the photoresist 502 can be transferred to the implementation of the one or more implantation and/or etching processes, and the metal substrate 104 can be patterned. As shown in FIG. 8, the one or more polymer films 102 can also be subject to the pattern transfer implemented via the one or more lithography processes.

Figure 9:
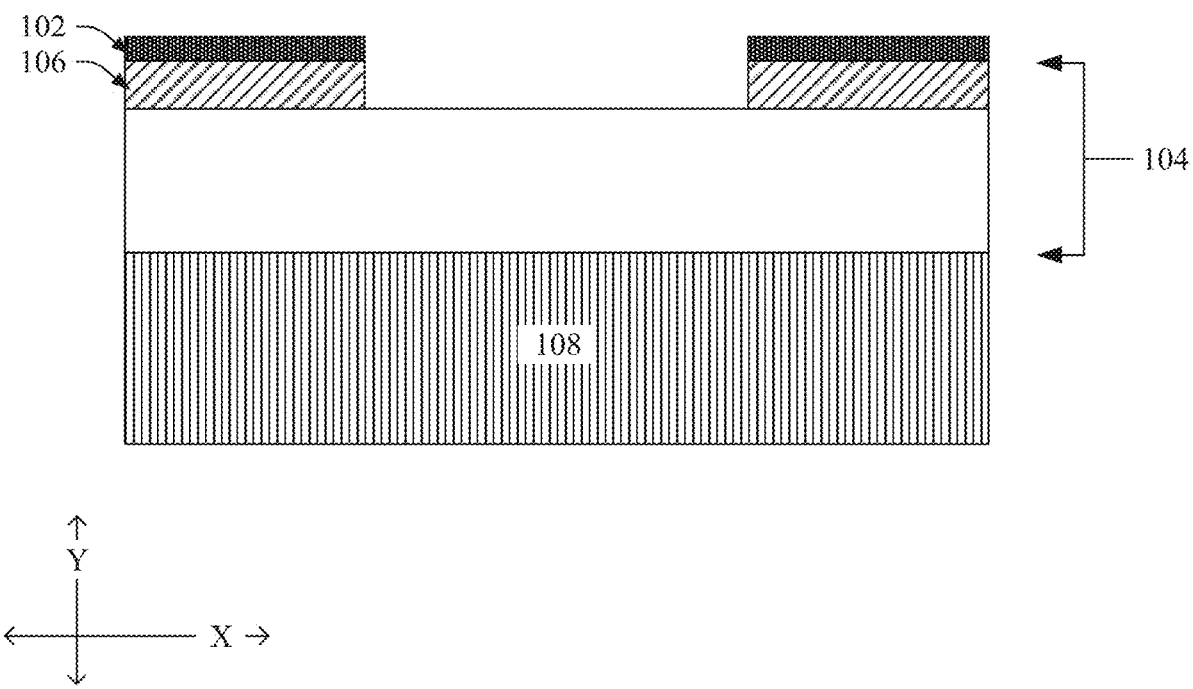
FIG. 9 illustrates a diagram of an example, non-limiting metal substrate protection structure during a fifth stage of a lithography process in accordance with one or more embodiments described herein.

FIG. 9 illustrates a diagram of the example, non-limiting metal protection structure 100 being implemented within a fifth stage of one or more lithography processes in accordance with one or more embodiments described herein. Repetitive description of like elements employed in other embodiments described herein is omitted for sake of brevity. During the fifth stage of the one or more lithography processes, the photoresist 502 can be removed from the one or more polymer films 102.

In various embodiments, the photoresist 502 can be stripped from the one or more polymer films 102 via one or more wet stripping or dry stripping techniques. For example, the photoresist 502 can be removed via one or more plasma stripping techniques. During the photoresist 502 removal, the one or more polymer films 102 can protect the metal substrate 104 from undesirable degradation. For example, FIG. 9 illustrates an embodiment in which at least a portion of the polymer film 102 remains bonded to the metal substrate 104. In another example, removal of the photoresist 502 can include a plasma stripping that is reactive towards organic polymers, wherein the polymer film 102 can act as a sacrificial layer and be removed with the photoresist 502 (e.g., leaving the patterned metal substrate 104 exposed).

One of ordinary skill in the art will recognize that the metal substrate 104 can be patterned via multiple lithography processes. In one or more embodiments, the one or more polymer films 102 can be established prior to the plurality of lithography processes and protect the metal substrate 104 throughout the patterning. In addition, or alternatively, the one or more polymer films 102 can be established, or re-established, between lithography processes in accordance with the various embodiments described herein.

Figure 10:
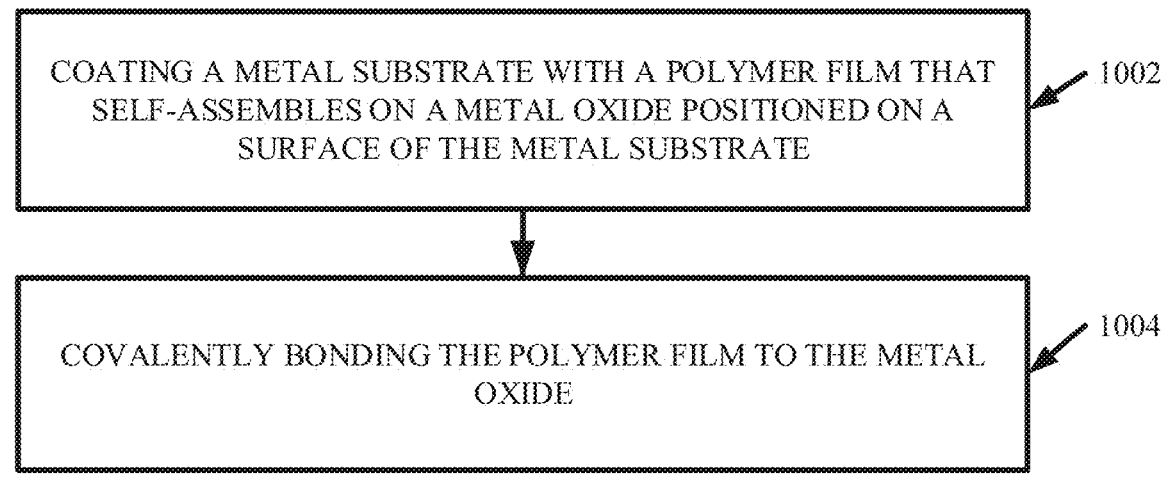
FIG. 10 illustrates a flow diagram of an example, non-limiting method that can facilitate manufacturing one or more metal substrate protection structures that can be employed in preparation of one or more lithography processes in accordance with one or more embodiments described herein.

FIG. 10 illustrates a flow diagram of an example, non-limiting method 1000 that can facilitate manufacturing the metal protection structure 100 in accordance with one or more embodiments described herein. Repetitive description of like elements employed in other embodiments described herein is omitted for sake of brevity. In various embodiments, method 1000 can be implemented to protect one or more metal substrates 104 from one or more undesirable chemical reactions with one or more developer solutions 702 implemented in one or more lithography processes.

At 1002, the method 1000 can comprise coating one or more metal substrates 104 with one or more polymer films 102 that can self-assemble on one or more metal oxides positioned on one or more surfaces (e.g., metal oxide surfaces 106) of the metal substrate 104. In accordance with the various embodiments described herein, the one or more metal oxides can be native to the one or more metal substrates 104 and/or can be induced by one or more chemical reactions (e.g., at least partially induced by an oxygen plasma cleaning process). Further, the one or more polymer films 102 can include one or more organic polymers and/or co-polymers (e.g., polystyrene, polyvinyl, poly(styrene-vinyl), and/or the like) comprising alkyl and/or aryl chemical structures. Additionally, the one or more organic polymers and/or co-polymers of the one or more polymer films 102 can include one or more functional groups (e.g., pendent functional groups) that can bond (e.g., covalently or electrostatically) to the one or more metal oxides. Example functional groups can include, but are not limited to: phosphonic acid groups, hydroxamic acid groups, carboxylic acid groups, a combination thereof, and/or the like. In various embodiments, the one or more polymer films 102 can form monolayers or a thin film on the metal oxides (e.g., on the one or more metal oxide surfaces 106).

At 1004, the method 1000 can comprise covalently bonding the one or more polymer films 102 to the one or more metal oxides. As described herein, the one or more polymer films 102 can comprise organic polymers and/or co-polymers that can self-assemble on the one or more metal oxides. Further, the one or more polymer films 102 can be heated to remove diluents and/or catalyze covalent bonding between the functional groups of the polymers and/or co-polymers and the one or more metal oxides (e.g., metal oxide surfaces 106). In various embodiments, the covalent bonding at 1004 can result in an ordered arrangement of the one or more organic polymers and/or co-polymers that can continuously, or near continuously, cover the one or more metal substrates 104.

Figure 11:
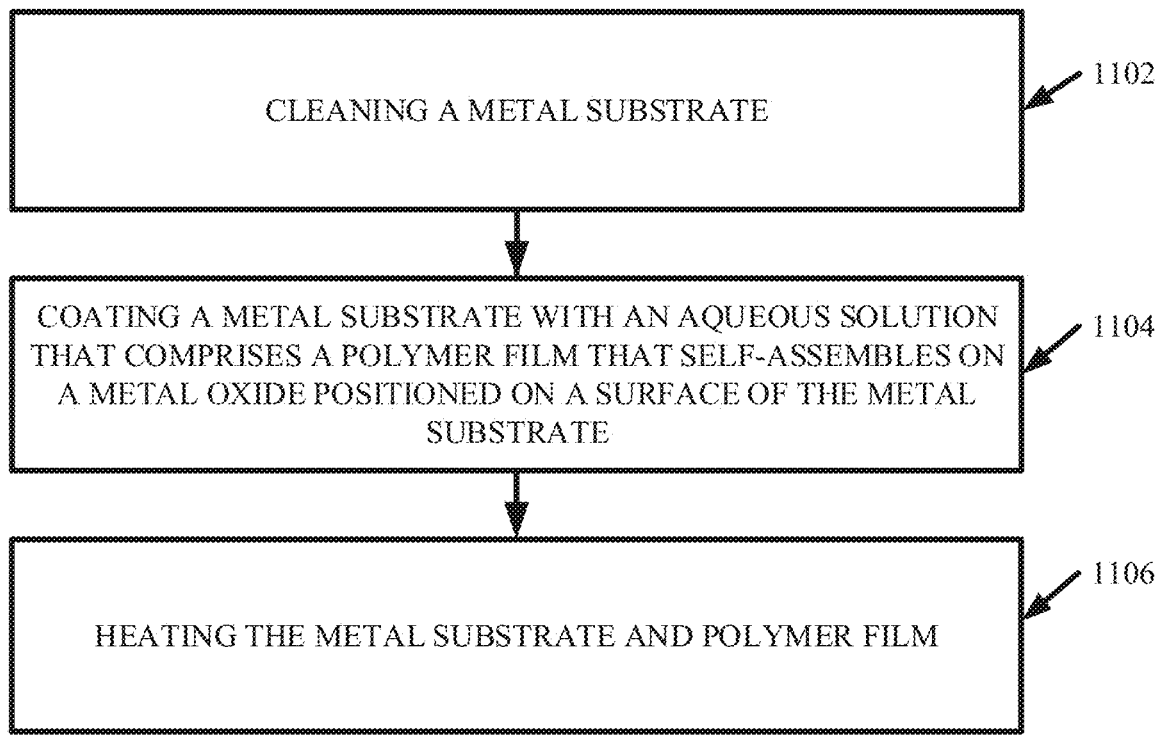
FIG. 11 illustrates a flow diagram of an example, non-limiting method that can facilitate manufacturing one or more metal substrate protection structures that can be employed in preparation of one or more lithography processes in accordance with one or more embodiments described herein.

FIG. 11 illustrates a flow diagram of an example, non-limiting method 1100 that can facilitate manufacturing the metal protection structure 100 in accordance with one or more embodiments described herein. Repetitive description of like elements employed in other embodiments described herein is omitted for sake of brevity. In various embodiments, method 1100 can be implemented to protect one or more metal substrates 104 from one or more undesirable chemical reactions with one or more developer solutions 702 implemented in one or more lithography processes.

At 1102, the method 1100 can comprise cleaning one or more metal substrates 104. In accordance with the various embodiments described herein, one or more cleaning processes can be implemented at 1102, including, but not limited to: an oxygen plasma cleaning, an ultraviolet-ozone cleaning, a wet process cleaning (e.g., comprising successive washes with acetone, alcohol, and water), a combination thereof, and/or the like.

At 1104, the method 1100 can comprise coating one or more metal substrates 104 with one or more aqueous solutions 302 comprising one or more polymer films 102 that can self-assemble on one or more metal oxides positioned on one or more surfaces (e.g., metal oxide surfaces 106) of the metal substrate 104. In accordance with the various embodiments described herein, the one or more metal oxides can be native to the one or more metal substrates 104 and/or can be induced by one or more chemical reactions (e.g., at least partially induced by an oxygen plasma cleaning process performed at 1102). As described herein, the one or more aqueous solutions 302 can comprise the constituents of the polymer film 102 along with one or more solvents and/or surfactants. Additionally, the one or more aqueous solutions 302 can be coated onto the one or more metal substrates 104 via one or more deposition processes that can include, but are not limited to: spin coating, doctor blading, immersion coating (e.g., dip coating), roller coating, spray coating, wipe coating, a combination thereof, and/or the like.

Further, the constituents of the one or more polymer films 102 can include one or more organic polymers and/or co-polymers (e.g., polystyrene, polyvinyl, poly(styrene-vinyl), and/or the like) comprising alkyl and/or aryl chemical structures. Additionally, the one or more organic polymers and/or co-polymers of the one or more polymer films 102 can include one or more functional groups (e.g., pendent functional groups) that can bond (e.g., covalently or electrostatically) to the one or more metal oxides. Example functional groups can include, but are not limited to: phosphonic acid groups, hydroxamic acid groups, carboxylic acid groups, a combination thereof, and/or the like. In various embodiments, the one or more polymer films 102 can form monolayers or a thin film on the metal oxides (e.g., on the one or more metal oxide surfaces 106).

At 1106, the method 1100 can comprise heating the one or more metal substrates 104 and/or polymer films 102. For example, the heating at 1106 can evaporate one or more diluents (e.g., solvents and/or surfactants) from the one or more aqueous solutions 302. Further, the heating at 1106 can catalyze one or more chemical reactions between the polymer film 102 and the one or more metal oxides (e.g., the one or more metal oxide surfaces 106. In various embodiments, method 1100 can establish the polymer film 102 that can protect the one or more metal substrates 104 from undesirable chemical reactions.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

It is, of course, not possible to describe every conceivable combination of components, products and/or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A method, comprising:
   providing a metal substrate having a plurality of metal oxide surfaces native to the metal substrate and positioned at multiple, non-continous locations of surfaces on the metal substrate, wherein the metal substrate has a thickness between 20 nanometers and 5 micrometers;
   coating the metal oxide surfaces with a polymer film that self-assembles one or more layers on the metal oxide surfaces, wherein the coating is performed via immersion of the metal oxide surfaces in an aqueous solution comprising the polymer film;

covalently bonding the polymer film to the plurality of metal oxide surfaces by heating the metal substrate and the plurality of metal oxide surfaces on a hot plate at a temperature greater than or equal to 100 degrees Celsius and less than or equal to 140 degrees Celsius for between one and five minutes, and wherein the heating evaporates one or more solvents or surfactants from the aqueous solutions and catalyzes one or more interactions between the polymer film and the plurality of the metal oxide surfaces.

2. The method of claim 1, wherein the polymer film comprises an organic polymer comprising at least one functional group selected from the group consisting of: a pendant phosphonic acid group, a hydroxamic acid group, and a carboxylic acid group.

3. The method of claim 2, wherein the organic polymer is selected from the group consisting of poly(styrenephosphonic) acid and poly(vinylphosphonic acid).

4. The method of claim 1, wherein the polymer film comprises an organic co-polymer comprising at least one functional group selected from the group consisting of: a pendant phosphonic acid group, a hydroxamic acid group, and a carboxylic acid group.

5. The method of claim 4, wherein the organic co-polymer is-co-poly(styrene-vinylphosphonic acid).

6. The method of claim 1, wherein the polymer film is comprised within an aqueous solution that further includes a solvent and co-polymers, wherein the heating removes the solvent from the plurality of metal oxide surfaces, and wherein the metal oxide surfaces are between 1 nanometer and 3 nanometers thick.

7. The method of claim 1, further comprising:
applying, after the coating and the heating, a lithography process to the polymer film, and wherein the polymer film protects the metal substrate from chemically reacting with a base compound of the lithography process.

8. The method of claim 7, wherein the polymer film protects at least a portion of the metal substrate from reacting with a basic solution of the lithography process.

* * * * *